(12) United States Patent
Mitsuzuka

(10) Patent No.: US 7,830,143 B2
(45) Date of Patent: Nov. 9, 2010

(54) MAGNETIC SENSOR, METHOD OF MANUFACTURING THE SAME, AND ELECTRONIC DEVICE

(75) Inventor: Tsutomu Mitsuzuka, Yamanashi (JP)

(73) Assignee: NEC Corporation, Tokyo (JP)

( * ) Notice: Subject to any disclaimer, the term of this patent is extended or adjusted under 35 U.S.C. 154(b) by 914 days.

(21) Appl. No.: 11/715,935

(22) Filed: Mar. 9, 2007

(65) Prior Publication Data

US 2007/0210788 A1 Sep. 13, 2007

(30) Foreign Application Priority Data

Mar. 10, 2006 (JP) ............................... 2006-065336

(51) Int. Cl.
*G01R 33/09* (2006.01)
*H01L 43/08* (2006.01)
*G01B 7/14* (2006.01)

(52) U.S. Cl. .................................. 324/252; 324/207.21

(58) Field of Classification Search ............ 324/207.21, 324/252; 338/32 R; 257/421, 427; 360/313, 360/314, 415, 327; 327/510
See application file for complete search history.

(56) References Cited

U.S. PATENT DOCUMENTS

| | | | | |
|---|---|---|---|---|
| 4,283,679 A | * | 8/1981 | Ito et al. ..................... | 324/165 |
| 5,585,775 A | * | 12/1996 | Ishishita .................... | 338/32 R |

FOREIGN PATENT DOCUMENTS

| | | |
|---|---|---|
| EP | 0 801 313 A2 | 10/1997 |
| JP | 60-064484 | 4/1985 |
| JP | 04-133221 | 5/1992 |
| JP | 07-006915 | 1/1995 |
| JP | 07-029735 | 1/1995 |
| JP | 2545935 | 8/1996 |
| JP | 09-063843 | 3/1997 |
| JP | 09-119968 | 5/1997 |
| JP | 09-283735 | 10/1997 |
| JP | 2841657 | 10/1998 |
| JP | 2841658 | 10/1998 |

OTHER PUBLICATIONS

Magnetoresistance in Crystalline and Amorphous Fe-Co-Ni Based Alloys; Inagaki et al., Japanese Journal of Applied Physics, vol. 25, No. 10, Oct. 1986, pp. 1514-1517.*
A. Tsoukatos et al., "Deposition condition and thickness dependence on magnetic properties of sputtered NiFeCo thin films," Journal of Applied Physics, American Institute of Physics, vol. 79:8, Part 2A, Apr. 15, 1996, pp. 5446-5448.
T. Tatsumi et al., "Magnetic Properties and Magnetoresistance Effect in Evaporated NiFeCo Films," IEEE Translation Journal of Magnetics in Japan, vol. 5:5, May 1990, pp. 409-415.

* cited by examiner

*Primary Examiner*—Kenneth J Whittington
(74) *Attorney, Agent, or Firm*—Foley & Lardner LLP

(57) ABSTRACT

A magnetic sensor have a magnetic field sensing portion having an alloy metal thin film including Ni, Fe and Co as main components and having a magneto-resistance effect, and detects two or more magnetic fields, at least one of which magnetic fields to be detected is 2.5 mT or more, and among which magnetic fields to be detected the minimum magnetic field and the maximum magnetic field are separated by 0.5 mT or more. The alloy metal thin film has an absolute value of magneto-striction constant of $1.5 \times 10^{-5}$ or less, an anisotropic magnetic field of 8 Oe or more as well as 16 Oe or less, and a magnetic resistance change ratio of 2.5% or more. The alloy metal thin film is within a composition range which concurrently fulfills the following relations: $21x+19y \leq 1869$, $5x+28y \geq 546$, $y \leq 11$, and $x+y \geq 85$, where the composition ratio of Ni is represented by x % by weight, while the composition ratio of Co is represented by y % by weight.

15 Claims, 8 Drawing Sheets

— ON IC BOARD $Ni_{82}Fe_{10}Co_8$
······· ON IC BOARD $Ni_{80}Fe_{12}Co_8$
— — ON Si SUBSTRATE $Ni_{82}Fe_{10}Co_8$
------ ON Si SUBSTRATE $Ni_{80}Fe_{12}Co_8$

— $Ni_{83}Fe_{14}Co_3$
······· $Ni_{80}Fe_{12}Co_8$
— — $Ni_{76}Fe_{10}Co_{14}$

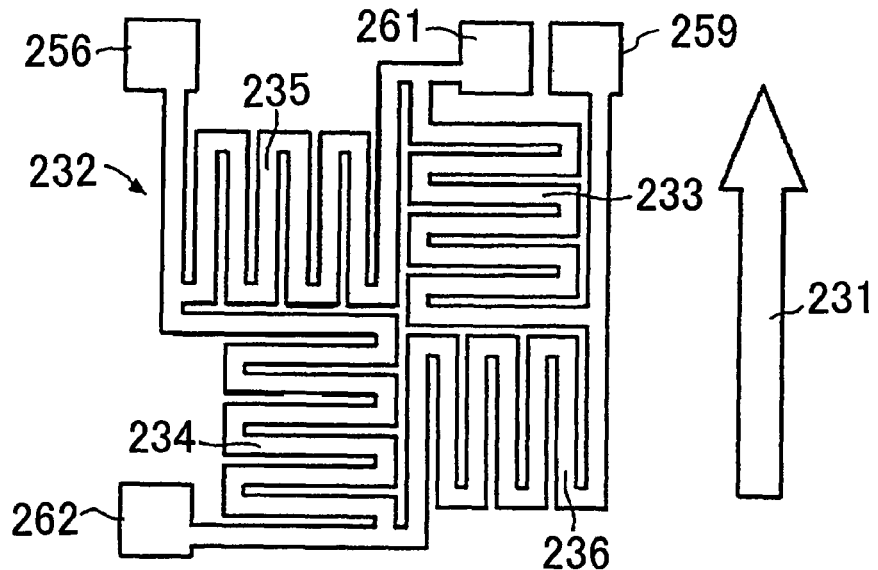
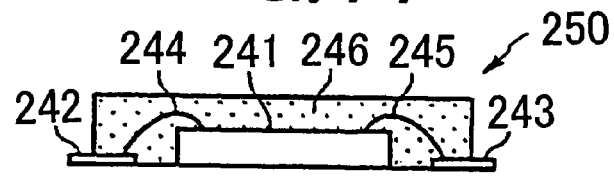
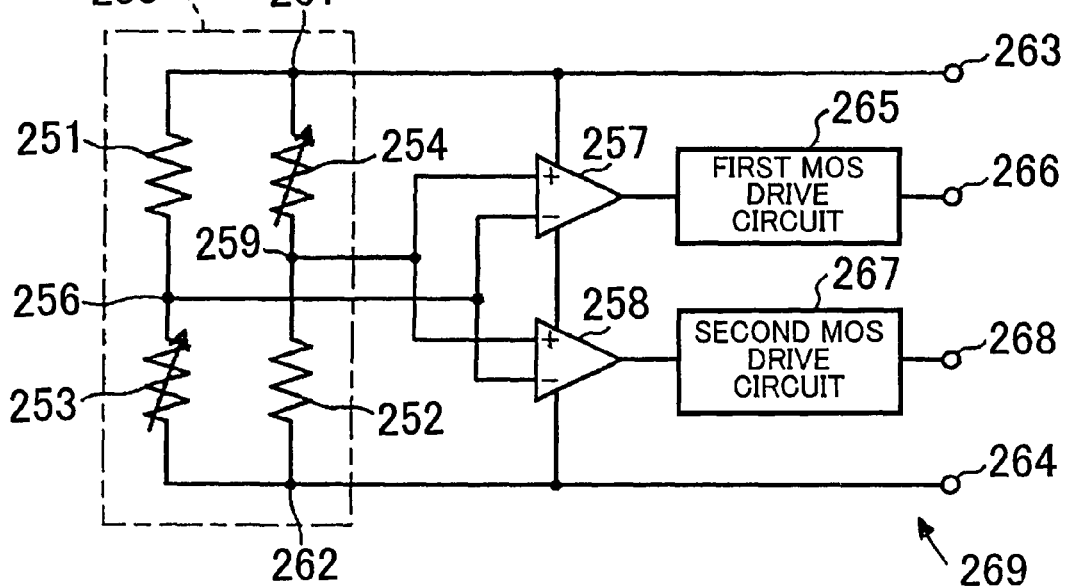

MAGNETIC SENSOR, METHOD OF MANUFACTURING THE SAME, AND ELECTRONIC DEVICE

BACKGROUND OF THE INVENTION

1. Field of the Invention

The present invention relates to a magnetic sensor that detects a magnetic field by utilizing the magneto-resistance effect, a method of manufacturing the same, and an electronic device using the magnetic sensor, and more particularly, to a magnetic sensor that can detect two or more different magnetic fields, a method of manufacturing the same, and an electronic device such as a flip phone or folded-type cellular phone that can detect a displacement of a part of member such as a part of housing using the magnetic sensor.

2. Description of Related Art

A magnetic sensor that detects a magnetic field by employing the anisotropic magneto-resistance effect is called also an MR (Magneto-Resistance) sensor. The magnetic sensor is widely used in a rotation detection device that detects the rotation of an object, in a position detection device that detects the relative position between objects, and in an opening/closing detection device that detects the opening/closing of a member such as a housing of an electronic device such as a cellular phone or a notebook personal computer.

In many of the MR sensors, NiFe (permalloy) is used as an element material representing the anisotropic magneto-resistance effect. The NiFe represents desirable soft magnetic characteristics of anisotropic magnetic field of approximately 4 Oe (oersted), which is suitable as a material of a high sensitivity magnetic sensor.

Furthermore, there has been proposed a first suggestion that a magneto-resistance effect thin film which is made of a ternary alloy of NiFeCo is used as a material of a magnetic sensor (for example, refer to Patent Document 1: JP(B)-2545935, Claims, FIG. 2 and Patent Document 2: JP(A)-9-283735, Claims). The first suggestion aims at the high magneto-resistance effect and high sensitivity by the magneto-resistance effect thin film made of the ternary alloy. The magneto-resistance effect thin film of the Patent Document 1 includes Ni, Fe and Co as main components, and the composition ratio of Ni is 80% or more by weight as well as 83% or less by weight, while the composition ratio of Co is 6% or more by weight as well as 9% or less by weight, and the magnetic resistance change ratio (MR ratio) is 5.1% or more, and the anisotropic magnetic field is 10 Oe or less. However, so as to get the magnetic resistance change ratio, a heat treatment of 200° C. or more as well as 400° C. or less is necessary prior to the patterning process for the magneto-resistance effect thin film, which restricts processes. In the ferromagnetic film of a magnetic resistance element of the Patent Document 2, the composition ratio of Ni is 82% by weight, the composition ratio of Fe is 10% or more by weight as well as 12% or less by weight, and the composition ratio of Co is 6% or more by weight as well as 8% or less by weight. The ferromagnetic film has a large magnetic resistance change ratio at a lower magnetic field (1 to 2 mT [milli-tesla]) of 2 to 2.5 times that of NiFe, and a positive magneto-striction constant of $+1.6 \times 10^{-6}$.

On the other hand, there has been proposed a second suggestion that $Ni_{1-x-y-z}Co_zX_xY_y$ is used for a magnetic resistance element (for example, refer to Patent Document 3: JP(B)-2841657, Claims, Table, FIG. 3). In this suggestion, X is a transition metal element that is selected from Ti, V, Cr, Mn, Fe, Cu, Ag, Zn, Zr, Nb, Hf, Mo, Ta, and W, while Y is a semimetal element that is selected from B, C, Al, Si, Ge, Ga, In, and Sn, and x is 0.005 to 10 atomic %, y 0.005 to 6 atomic %, x+y 0.01 to 12 atomic %, and z is 10 to 70 atomic %. By employing the second suggestion, it becomes possible to get a magneto-resistance effect alloy and a magnetic sensor using the same, which are high in sensitivity, small in hysteresis, and small in resistance value as well as temperature coefficient of resistance change ratio.

These first and second suggestions aim at the high sensitivity in magnetic sensitivity characteristics.

A magnetic sensor is required to be provided with new functions by the device side that uses the magnetic sensor. One of the functions is a detection output function of detecting two or more different magnetic fields. This function will be explained hereunder by taking a flip phone as an example.

FIG. 15 shows a side view of a flip phone that is of the closed state and of the opened state forming an angle, and there are shown two cases of the opened state whose respective angles are different from each other. In the flip phone, a first housing 101 and second housing 102 are connected to each other via a hinge mechanism 104 so as to be opened and closed. A magnetic sensor 103 is arranged in the first housing 101, and a magnet 105 is arranged in the second housing 102. A state where the second housing 102 is in close contact with the first housing 101 is the closed state of the second housing 102 and accordingly the flip phone.

When the second housing 102 is closed, since the distance therefrom to the first housing 101 is shortest, the magnetic field detected by the magnetic sensor 103 is large. In case the first housing 101 is fixed at a position shown in FIG. 15, when the second housing 102 is opened in a direction of an arrow 106, the magnetic field detected by the magnetic sensor 103 is made small gradually. Conventionally, a point when the magnetic field detected by the magnetic sensor 103 is made equal to or smaller than a predetermined value is detected using the output voltage change, and a back light of a display, not shown, arranged on the second housing 102 is controlled to be turned on at a predetermined rotation angle corresponding to the predetermined value of magnetic field detection. In this case, the number of the value of the magnetic field detected by the magnetic sensor 103, i.e. the number of the predetermined value of magnetic field detection, may be one.

On the other hand, it is assumed that there is required a flip phone that displays first information on the display when the second housing 102 is opened by an angle $\theta_1$, and displays second information replacing the first information on the display when the second housing 102 is opened by another angle $\theta_2$. This requirement is fulfilled when the magnetic sensor 103 is of the two-output detection type that detects a predetermined first value of magnetic field in case the second housing 102 is opened by the angle $\theta_1$ with respect to the first housing 101, and detects a predetermined second value of magnetic field in case the second housing 102 is opened by another angle $\theta_2$ with respect to the first housing 101.

In this way, a magnetic sensor of the multiple magnetic field detection type that detects two or more different magnetic fields, is required to use a magnetic thin film having magneto-resistance effect characteristics which are different from those of a magnetic sensor of the conventional single magnetic field detection type. In case of a magnetic sensor of the single magnetic field detection type, for example, only a magnetic sensor of high magnetic field sensitivity that can detect a faint magnetic field has to be developed. On the other hand, in case of a magnetic sensor of the multiple magnetic field detection type, the predetermined plural values of magnetic field detection are distributed within a wide range. Accordingly, there is required a magneto-resistance effect thin film that has its magnetic resistance sufficiently changed in a wide range from the low magnetic field side to the high magnetic field side.

Especially, in case of realizing a magnetic sensor that can detect a high magnetic field of 2.5 mT [milli-tesla] or more in magnetic flux density, a conventional NiFe thin film that has its magnetic resistance changed in a narrow magnetic field range cannot attain the magnetic sensor even if the magnetic sensitivity thereof is high. Furthermore, in case of the above-mentioned NiFeCo ternary thin film by the first and second suggestions, the Patent Documents 1 to 3 do not suggest as to whether the NiFeCo ternary thin film has the magnetic resistance sufficiently changed in the above-mentioned wide range from the low magnetic field side to the high magnetic field side, or not.

Furthermore, in case of using a magneto-resistance effect thin film having a high magneto-striction constant for the magnetic sensor of the multiple magnetic field detection type, the magnetic characteristics are widely changed according to respective stresses raised in forming a film, working upon a photoresist, and packaging. As a result, it becomes difficult to set the magnetic characteristics in a targeted range, which undesirably lowers the yield ratio of the magnetic sensor. Accordingly, it is desirable to use a magneto-resistance effect thin film having a low magneto-striction constant for the magnetic sensor of the multiple magnetic field detection type.

Moreover, in obtaining magneto-resistance effect thin films, it is desired that restrictions on processes are small from a viewpoint of the cost reduction.

SUMMARY OF THE INVENTION

It is therefore an object of the present invention to provide a magnetic sensor that detects two or more different magnetic fields, uses an alloy metal thin film having a magnetic resistance sufficiently changed in a wide range from the low magnetic field side to the high magnetic field side, and is scarcely affected by film stresses, and has small restrictions on processes. It is another object of the present invention to provide a method of manufacturing such a magnetic sensor. It is also still another object of the present invention to provide an electronic device using such a magnetic sensor.

According to the present invention, there is provided a magnetic sensor which detects two or more magnetic fields, at least one of which magnetic fields to be detected is 2.5 mT or more, and among which magnetic fields to be detected the minimum magnetic field and the maximum magnetic field are separated by 0.5 mT or more.

According to the present invention, there is provided a magnetic sensor which has an alloy metal thin film including Ni, Fe and Co as main components and having a magneto-resistance effect, the alloy metal thin film has an absolute value of magneto-striction constant ($\lambda$) of $1.5 \times 10^{-5}$ or less, an anisotropic magnetic field ($H_k$) of 8 Oe or more as well as 16 Oe or less, and a magnetic resistance change ratio (MR ratio) of 2.5% or more.

According to the present invention, there is provided a magnetic sensor which has an alloy metal thin film including Ni, Fe and Co as main components and having a magneto-resistance effect, wherein the alloy metal thin film is within a composition range which concurrently fulfills the following relations: $21x+19y \leq 1869$, $5x+28y \geq 546$, $y \leq 11$, and $x+y \geq 85$, where the composition ratio of Ni is represented by x % by weight, while the composition ratio of Co is represented by y % by weight.

In the magnetic sensor according to the present invention, the alloy metal thin film is arranged in a magnetic field sensing portion. The magnetic sensor according to the present invention has a detecting circuit portion connected to the magnetic field sensing portion, wherein the detecting circuit portion detects the two or more magnetic fields on the basis of a sensing signal of the magnetic field sensing portion.

In the magnetic sensor according to the present invention, the detecting circuit portion is formed on an integrated circuit board, and the alloy metal thin film is formed on the integrated circuit board via an insulating film. The detecting circuit portion and the magnetic field sensing portion are formed into a chip including the integrated circuit board, the chip is sealed with a resin package, and the detecting circuit portion is connected to an external terminal partially exposed to the outside from the resin package.

According to the present invention, there is provided a method of manufacturing a magnetic sensor, comprising an integrated circuit forming step of forming as an integrated circuit a detecting circuit for detecting a plurality of magnetic fields of different intensities on a substrate or base board to obtain an integrated circuit board, and an alloy metal thin film forming step of forming an alloy metal thin film on the integrated circuit board obtained in the integrated circuit forming step.

According to the present invention, there is provided an electronic device that includes a magnetic sensor which detects a plurality of magnetic fields of different intensities, and a control circuit which outputs a control signal which varies depending on plural detection results with respect to the magnetic fields by the magnetic sensor.

According to the present invention, there is provided an electronic device that includes a magnet, a magnetic sensor having the alloy metal thin film which senses magnetic fields generated by the magnet, and a control circuit which outputs a control signal which varies depending on plural detection results with respect to the magnetic fields by the magnetic sensor.

In this way, according to the present invention, there are provided an alloy metal thin film which includes Ni, Fe and Co as main components and has the magneto-resistance effect, a magnetic sensor having the alloy metal thin film, a method of manufacturing the magnetic sensor, and an electronic device using the magnetic sensor, wherein the absolute value of the magneto-striction constant ($\lambda$) of the alloy metal thin film is $1.5 \times 10^{-5}$ or less, the anisotropic magnetic field ($H_k$) thereof is 8 Oe or more as well as 16 Oe or less, and the magnetic resistance change ratio (MR ratio) thereof is 2.5% or more. Accordingly, when configuring a magnetic sensor that detects an external magnetic field in case the external magnetic field gets to a predetermined magnetic field or more using the alloy metal thin film, it becomes possible to provide a magnetic sensor that detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more, and an electronic device using the magnetic sensor.

Furthermore, according to the present invention, there are provided an alloy metal thin film which includes Ni, Fe and Co as main components and has the magneto-resistance effect, a magnetic sensor having the alloy metal thin film, a method of manufacturing the magnetic sensor, and an electronic device using the magnetic sensor, wherein the alloy metal thin film is within a composition range that concurrently fulfills $21x+19y \leq 1869$, $5x+28y \geq 546$, $y \leq 11$, and $x+y \geq 85$, where the composition ratio of Ni is represented by x % by weight, while the composition ratio of Co is represented by y % by weight. Accordingly, when configuring a magnetic sensor that detects an external magnetic field in case the external magnetic field gets to a predetermined magnetic field or more using the alloy metal thin film, it becomes possible to provide a magnetic sensor that detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more, and an electronic device using the magnetic sensor.

An alloy metal thin film that is used for a magnetic sensor and has the magneto-resistance effect is a thin film which includes Ni, Fe and Co as main components, and is within a composition range that concurrently fulfills $21x+19y \leq 1869$, $5x+28y \geq 546$, $y \leq 11$, and $x+y \geq 85$, where the composition ratio of Ni is represented by x % by weight, while the composition ratio of Co is represented by y % by weight. By employing such a composition range, the alloy metal thin film can show the magnetic characteristics in which the absolute value of the magneto-striction constant ($\lambda$) is $1.5 \times 10^{-5}$ or less, the anisotropic magnetic field ($H_k$) is 8 Oe or more as well as 16 Oe or less, and the magnetic resistance change ratio (MR ratio) is 2.5% or more.

By fulfilling the magnetic characteristics, it becomes possible to sufficiently make a magnetic sensor operate, which detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more. That is, the magnetic sensor detects two or more different magnetic fields, because the alloy metal thin film has a magnetic resistance sufficiently changed in a wide range from the low magnetic field side to the high magnetic field side, especially about each of the magnetic fields to be detected.

Furthermore, even if the composition range is not within the above-described range, a desired magnetic sensor can be realized when the magnetic characteristics of an alloy metal thin film are set up such that the absolute value of the magneto-striction constant ($\lambda$) is $1.5 \times 10^{-5}$ or less, the anisotropic magnetic field ($H_k$) is 8 Oe or more as well as 16 Oe or less, and the magnetic resistance change ratio (MR ratio) is 2.5% or more by adjusting the method of forming a film (film forming system, temperature of substrate or base board, etc.) and the method of working.

As has been described above, according to the present invention, it becomes possible to obtain a magneto-resistance effect thin film whose magnetic resistance is changed in a wide region from the low magnetic field side to the high magnetic field side, and is scarcely affected by film stresses, and is not required to undergo the annealing before the patterning process for the magneto-resistance effect thin film, and has small restrictions on processes. As a result, it becomes possible to provide a magnetic sensor that detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more, and an electronic device using the magnetic sensor.

BRIEF EXPLANATION OF THE DRAWINGS

FIG. 10 is a view showing the magnetic field sensing portion in the embodiment;

FIG. 11 is a cross-sectional view of the magnetic sensor according to the embodiment of the present invention;

FIG. 12 a circuit diagram showing an example of a multiple magnetic field detection circuit in the embodiment;

DETAILED DESCRIPTION OF THE PREFERRED EMBODIMENTS

The present invention will further be described below with reference to the accompanying drawings.

Figure 1:
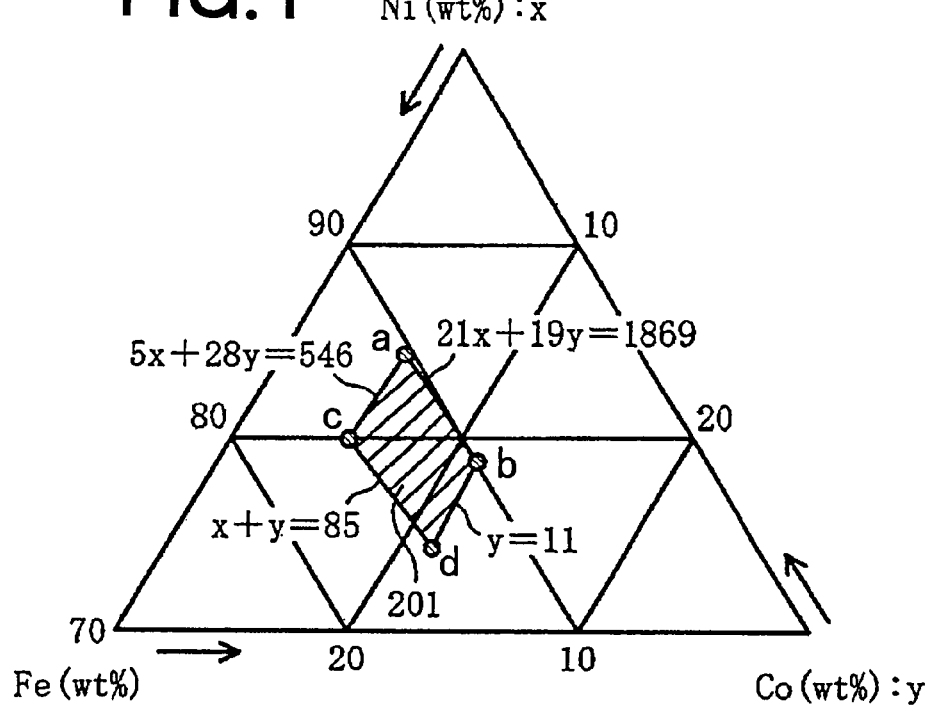
FIG. 1 is a diagram showing the composition range of a magneto-resistance effect thin film used in a magnetic sensor according to an embodiment of the present invention.

FIG. 1 is a diagram indicative of the composition range of a magneto-resistance effect thin film (referred to as magnetic film arbitrarily, hereinafter) as an alloy metal thin film which is used as a magnetic resistance element of a magnetic field sensing portion in a magnetic sensor according to an embodiment of the present invention. The magneto-resistance effect thin film used in this embodiment is an alloy metal thin film including Ni, Fe and Co as main components. The alloy metal thin film is within a composition range that concurrently fulfills the following mathematical expressions of (1) to (4), where the composition ratio of Ni is represented by x % by weight, while the composition ratio of Co is represented by y % by weight:

$$21x+19y \leq 1869 \quad (1)$$

$$5x+28y \geq 546 \quad (2)$$

$$y \leq 11 \quad (3)$$

$$x+y \geq 85 \quad (4)$$

Area within the composition range that concurrently fulfills the mathematical expressions of (1) to (4) corresponds to a quadrangle 201 and the inside thereof shown in FIG. 1. Corners of the quadrangle 201, i.e. intersections a, b, c and d of the respective adjacent two sides of the four sides of the quadrangle 201, are approximately a ($Ni_{85.1}, Fe_{10.6}, Co_{4.3}$), b ($Ni_{79.0}, Fe_{10.0}, Co_{11.0}$), c ($Ni_{79.7}, Fe_{15.0}, Co_{5.3}$), and d ($Ni_{74.0}, Fe_{15.0}, Co_{11.0}$).

When forming a magnetic film within the composition range with its film thickness set to 40 nm, the absolute value of the magneto-striction constant ($\lambda$) of the magnetic film comes to be $1.5 \times 10^{-5}$ or less, the anisotropic magnetic field ($H_k$) thereof comes to be 8 Oe or more as well as 16 Oe or less, and the magnetic resistance change ratio (MR ratio) thereof comes to be 2.5% or more. It is desirable that the thickness of the magnetic film be 20 nm or more as well as 60 nm or less. In case the thickness of the magnetic film is excessively decreased to be less than 20 nm, there tends to be raised a problem in the continuity of the magnetic film width and in the migration resistance. In case the thickness of the magnetic film is excessively increased to be more than 60 nm, there tends to be raised a problem of the increase of power consumption due to the lowering of resistance value.

In forming the magnetic film, it is desirable that the vacuum evaporation method be employed. In case the sputtering method is employed, the magnetic film is prone to receive a compressive stress in the order of GPa (giga-pascal). Accordingly, the magnetic characteristics are changed due to the influence of stress relaxation every time a process step of generating heat is performed, which tends to make it difficult to attain targeted magnetic characteristics.

The relation between the composition range of the magnetic film and the magnetic characteristics of the magnetic film will be explained in detail. It is not necessary to carry out the annealing immediately after forming the magnetic film so as to attain the magnetic characteristics.

Figure 2:
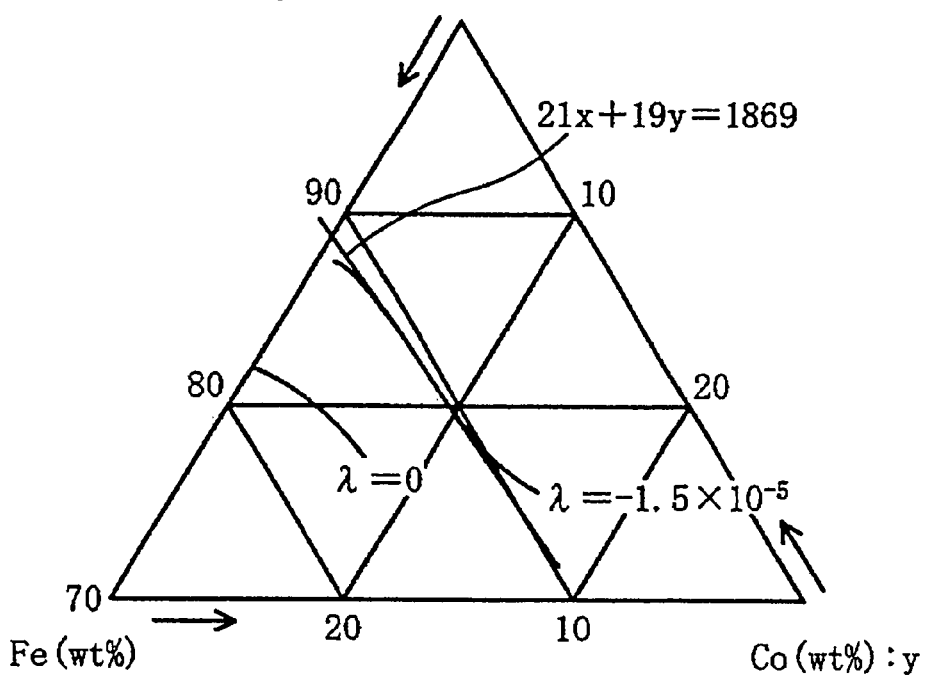
FIG. 2 is a diagram showing a ternary state of the magneto-striction constant ($\lambda$) of a NiFeCo magnetic film formed by employing the vacuum evaporation method in the embodiment.

FIG. 2 is a diagram indicative of the ternary state of the magneto-striction constant ($\lambda$) of an NiFeCo magnetic film that is formed by employing the vacuum evaporation method in the embodiment. The thickness of the magnetic film is 52 nm. When the composition ratio of Ni is represented by x % by weight, and the composition ratio of Co is represented by y % by weight, a part of the line of the composition corresponding to "$\lambda = -1.5 \times 10^{-5}$" comes into contact with a straight line of "$21x+19y=1869$". In the region coming into contact with the straight line, when "$21x+19y \leq 1869$", the $\lambda$ comes to be "$|\lambda| \leq 1.5 \times 10^{-5}$".

Figure 3:
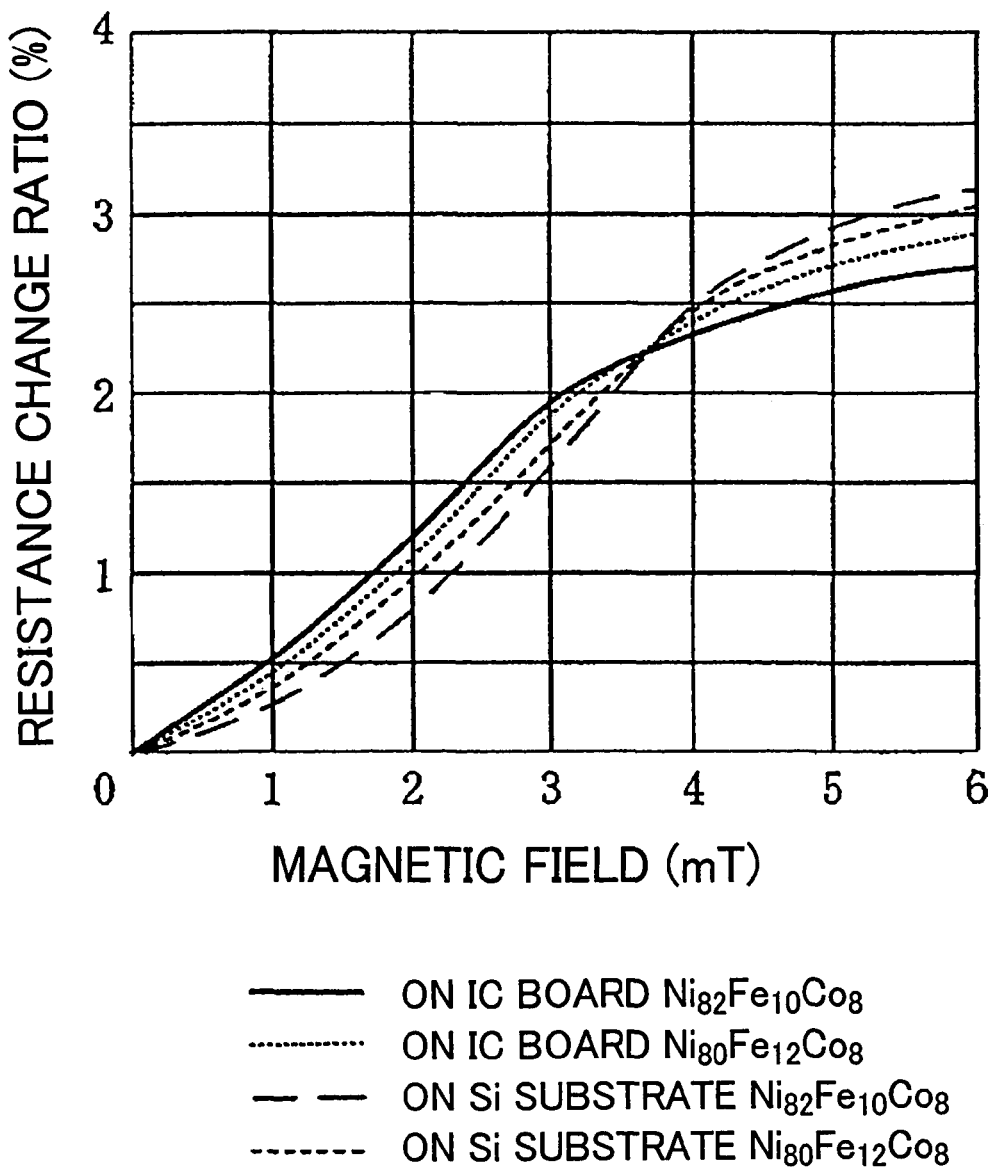
FIG. 3 is a diagram showing the resistance change ratio of $Ni_{80}Fe_{12}Co_8$ magnetic film and $Ni_{82}Fe_{10}Co_8$ magnetic film formed on an IC board and Si substrate relative to the magnetic field in the embodiment.

FIG. 3 shows a graphical representation indicative of the resistance change ratio of $Ni_{80}Fe_{12}Co_8$ magnetic film of "$\lambda = -1.1 \times 10^{-5}$" and $Ni_{82}Fe_{10}Co_8$ magnetic film of "$\lambda = -1.7 \times 10^{-5}$". There are shown resistance change ratios of both the magnetic films formed on an IC (Integrated Circuit) board or base plate having roughness and those of both the magnetic films formed on a smooth $SiO_2$/Si substrate, respectively. On the IC board, the stress applied from a protective film or protective layer to a magnetic film or magnetic layer becomes small due to the roughness, while on the smooth $SiO_2$/Si board, the stress applied from a protective film to a magnetic film becomes large. The resistance change ratio of $Ni_{82}Fe_{10}Co_8$ magnetic film whose absolute value of magneto-striction constant is large is sensitive with respect to the stress, and the difference between the resistance change ratios due to the different board or substrate is large as shown in FIG. 3. As a result, the resistance change ratio curve is widely changed due to the thermal stress every time a working step of applying heat is performed, which makes it difficult to set the resistance change ratio curve to a targeted one at the time of the production. In this way, when the resistance change ratio of the magnetic film is sensitive with respect to the stress, even if products are nondefective immediately after the film forming working step, there may be raised many defective products after the packaging step in which the thermal stress is applied to the products.

Figure 4:
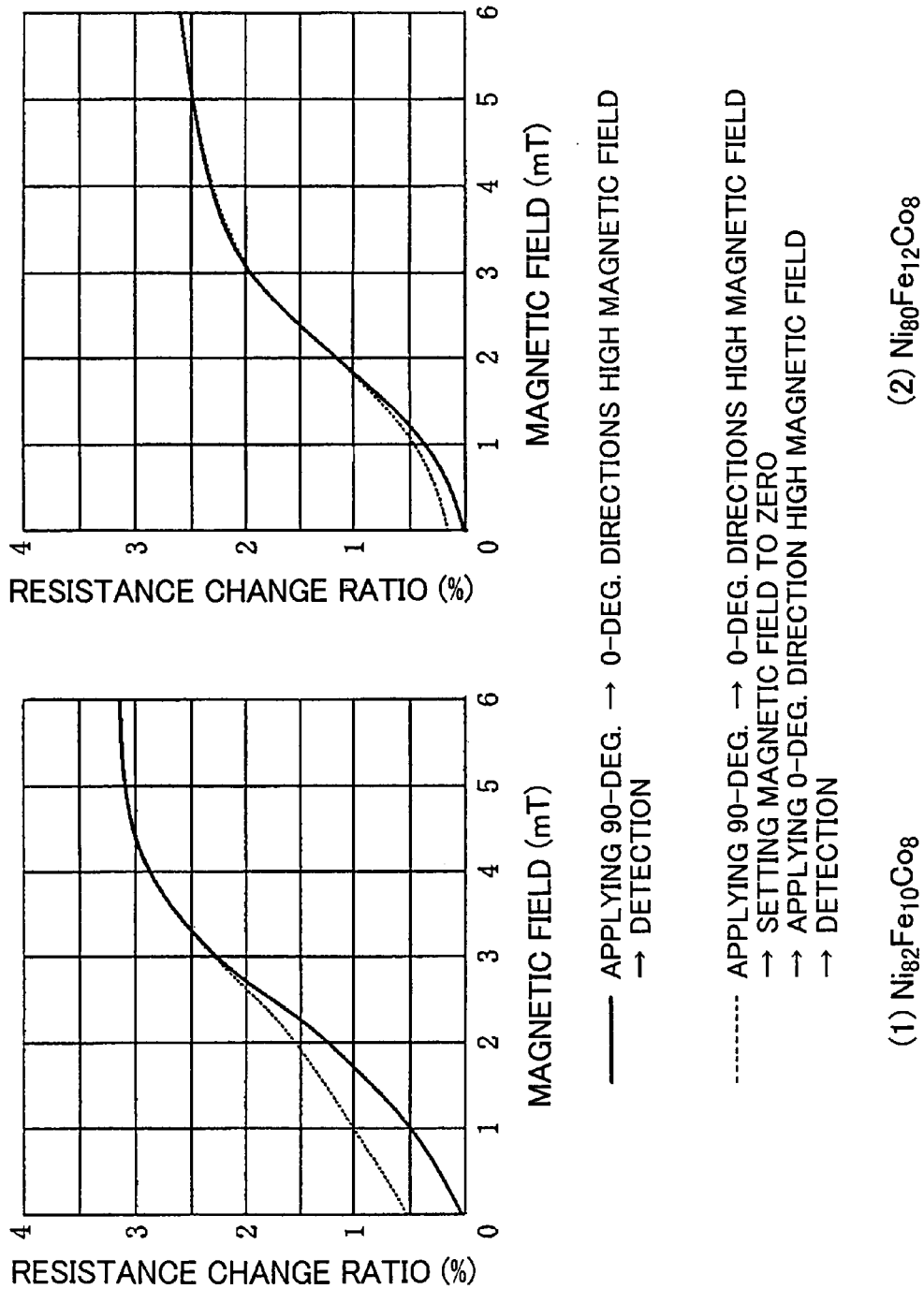
FIG. 4 is a diagram showing an initial magnetization direction dependence of the resistance change ratio of $Ni_{82}Fe_{10}Co_8$ magnetic film and $Ni_{80}Fe_{12}Co_8$ magnetic film in the embodiment.

FIG. 4 shows a graphical representation indicative of the initial magnetization direction dependence of the resistance change ratio of $Ni_{82}Fe_{10}Co_8$ magnetic film of "$\lambda = -1.7 \times 10^{-5}$" and $Ni_{80}Fe_{12}Co_8$ magnetic film of "$\lambda = -1.1 \times 10^{-5}$". FIG. 4 (1) shows the case of the $Ni_{82}Fe_{10}Co_8$ magnetic film, while FIG. 4 (2) shows the case of the $Ni_{80}Fe_{12}Co_8$ magnetic film.

In FIG. 4, the solid line shows the result obtained by firstly applying a high magnetic field in a direction angulated by 90 degrees from a general direction for applying magnetic field onto a magnetic sensor using a magnet such as a permanent magnet, then applying a high magnetic field in a direction angulated by 0 degree therefrom, and then detecting the resistance change ratio. On the other hand, the dotted line shows the result obtained by thereafter returning or setting the magnetic field to zero once, and applying a high magnetic field in a direction angulated by 0 degree again, and then detecting the resistance change ratio. In case of the $Ni_{82}Fe_{10}Co_8$ magnetic film, the dependence of the resistance change ratio on initial magnetization direction or initially applied magnetic field direction is high and the difference of the measurement results between the cases of solid line and dotted line is large. On the other hand, in case of the $Ni_{80}Fe_{12}Co_8$ magnetic film, the dependence of the resistance change ratio on initial magnetization direction or initially applied magnetic field direction is low and the difference of the measurement results between the cases of solid line and dotted line is small. The $Ni_{82}Fe_{10}Co_8$ magnetic film, which is largely influenced by the 90-degree magnetic field, stands up poorly to the disturbance of an external magnetic field, and is not appropriate for a magnetic sensor of the present invention.

Figure 5:
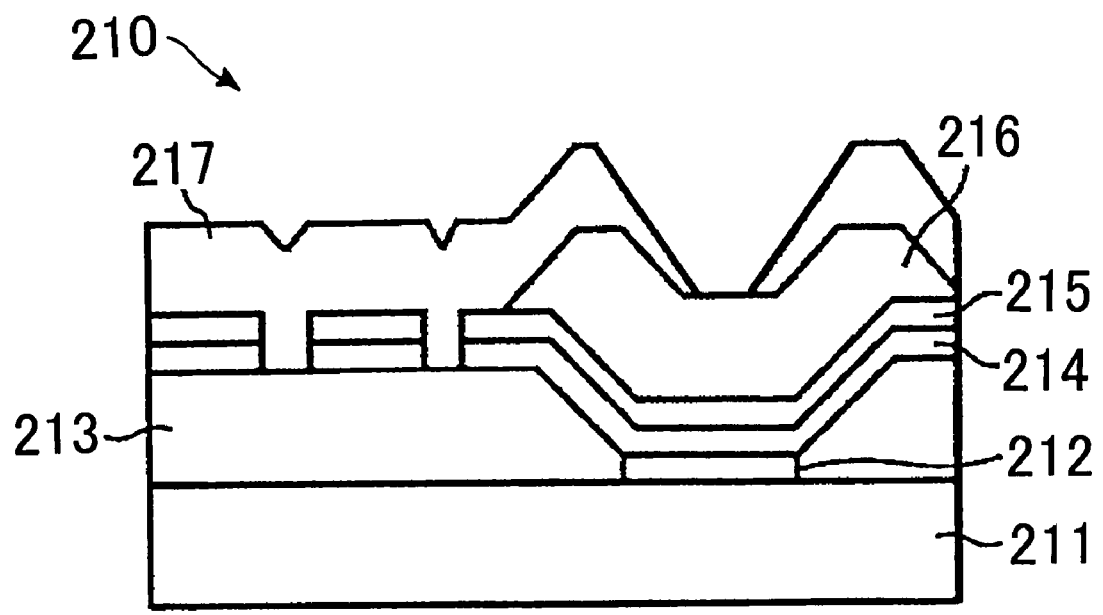
FIG. 5 is a view showing an end configuration of a cut surface which is obtained by cutting off part of a magnetic sensor along a predetermined plane perpendicular to the bottom surface in the embodiment.

FIG. 5 shows a view indicative of the end configuration of a cut surface which is obtained by cutting off a part of a magnetic sensor 210 along a predetermined plane perpendicular to the bottom surface of the magnetic sensor. The magnetic sensor 210 has an IC board or base plate 211 on which an Al pad portion 212 is formed. The IC board 211 has its part other than the Al pad portion 212 covered by an insulating protective film 213 made of SiN, SiON, $SiO_2$, etc. On the Al pad portion 212 and insulating protective film 213, a magneto-resistance effect thin film 214, titanium film 215, gold film 216 are evaporated in this order by employing the vacuum evaporation method respectively. The magneto-resistance effect thin film 214 is formed within above-described composition range in this embodiment, and has the above-described magnetic characteristics. The gold film 216 is formed for the bonding contact, and the titanium film 215 is formed to improve the adhesiveness between the gold film 216 and the magneto-resistance effect thin film 214 made of a NiFeCo alloy. The gold film 216 has its part exposed to the outside for the bonding, and has its other part covered by an insulating film 217.

In thus configured magnetic sensor 210, the magneto-resistance effect thin film 214 is patterned to form a magnetic resistance element, which is used for constituting a magnetic field sensing portion. FIG. 10 shows the magnetic field sensing portion 232 having the magnetic resistance elements. As shown in FIG. 10, the magneto-resistance effect thin film 214 is patterned into a zigzag shape to thereby form four magnetic resistance elements 233, 234, 235, 236. The magnetic resistance elements 233, 234, 235, 236 are connected to each other to form a bridge circuit. Reference numerals 256, 259, 261, 262 each denotes a terminal pad portion. The magnetic resistance element is designed such that the longitudinal direction of the zigzag shape is a magnetization direction when there is no external magnetic field applied.

It is assumed that a magnetic field is applied in a direction of an arrow 231 shown in FIG. 10. Among the magnetic resistance elements, first magnetic resistance elements 233, 234, whose longitudinal direction of the zigzag shape is perpendicular to the magnetic field application direction, have their resistance values raised due to the magnetic field application. On the other hand, second magnetic resistance elements 235, 236, whose longitudinal direction of the zigzag shape is parallel with the magnetic field application direction, have their resistance values slightly changed even if the magnetic field is applied. That is, the resistance values of the second magnetic resistance elements 235, 236 is substantially constant.

In case the negative magneto-striction constant is large, the magneto-resistance effect thin film 214 is prone to be influenced by a stress, and the magnetization direction is prone to be angulated with respect to the longitudinal direction of the zigzag shape due to a compressive stress at the under-mentioned packaging. In this case, the magnetization direction is not returned to the longitudinal direction after applying the 90-degree magnetic field, which makes the initial magnetization direction dependence or initially applied magnetic field direction dependence high.

Due to the reason described with reference to FIGS. 3-5 and FIG. 10, so as to remove the influence of a stress and improve the yield ratio, the magneto-striction constant ($\lambda$) is required to be set to "$|\lambda| \leq 1.5 \times 10^{-5}$".

Figure 6:
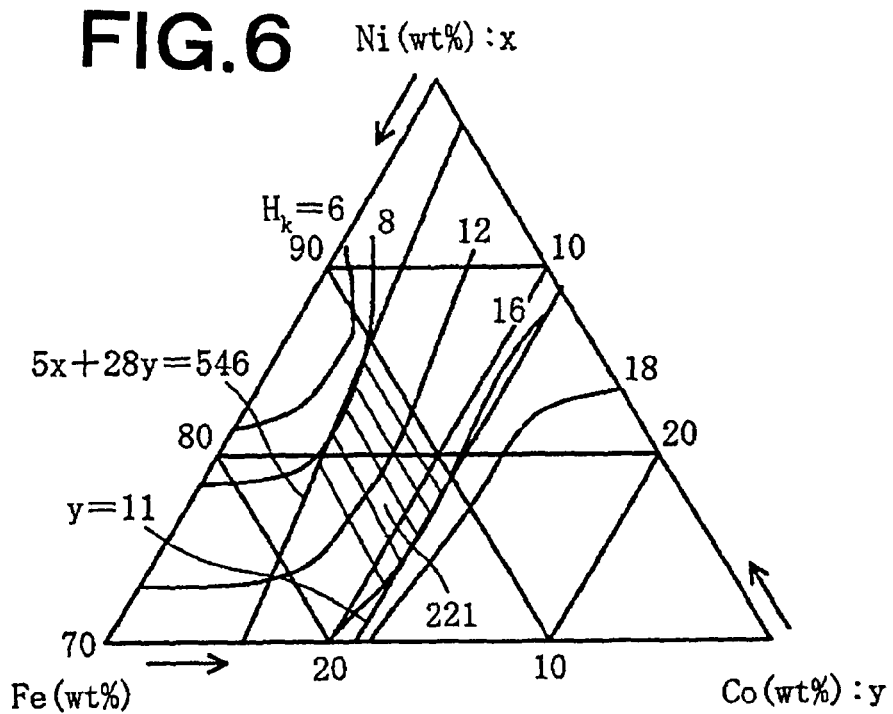
FIG. 6 is a diagram showing a ternary state of the anisotropic magnetic field ($H_k$) of a NiFeCo magnetic film formed by employing the vacuum evaporation method in the embodiment.

FIG. 6 is a diagram indicative of the ternary state of the anisotropic magnetic field ($H_k$) of a NiFeCo magnetic film that is formed by employing the vacuum evaporation method. The thickness of the magnetic film is 40 nm. A part of the line of the composition corresponding to "$H_k = 8$ Oe" comes into contact with a straight line of "$5x+28y=546$", while a part of the line of the composition corresponding to "$H_k = 16$ Oe" comes into contact with a straight line of "$y \leq 11$". In the region coming into contact with the straight lines, when "$5x+28y \geq 546$, and $y \leq 11$", the $H_k$ comes to be "8 Oe$\leq H_k \leq$16 Oe". This region is represented by a shaded area 221 shown in FIG. 6.

Figure 7:
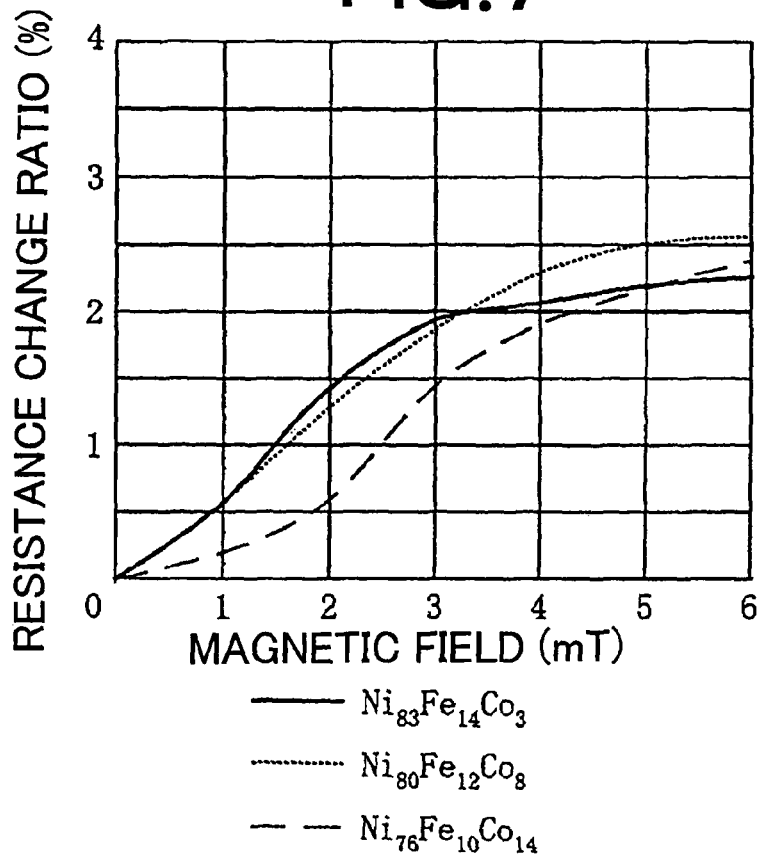
FIG. 7 is a diagram showing a comparison of $Ni_{83}Fe_{14}Co_3$ magnetic film whose anisotropic magnetic field is 6 Oe, $Ni_{80}Fe_{12}Co_8$ magnetic film of 12 Oe, and $Ni_{76}Fe_{10}Co_{14}$ magnetic film of 18 Oe in the embodiment.

FIG. 7 shows a graphical representation which compares $Ni_{83}Fe_{14}Co_3$ magnetic film whose anisotropic magnetic field ($H_k$) is 6 Oe, $Ni_{80}Fe_{12}Co_8$ magnetic film of 12 Oe, and $Ni_{76}Fe_{10}Co_{14}$ magnetic film of 18 Oe. The $Ni_{83}Fe_{14}Co_3$ magnetic film is fast in initial rise with respect to the magnetic field, and the resistance value is changed by 0.5% from 1.0 to 1.5 mT. Then, the uprise of the resistance change ratio is made gradual from around 2.5 mT, and the resistance change ratio from 3.0 to 3.5 mT is only 0.1%. Accordingly, it is difficult to detect a magnetic field in a high magnetic field.

The $Ni_{76}Fe_{10}Co_{14}$ magnetic film is slow in initial rise with respect to the magnetic field, and even if the resistance change ratio from 3.0 to 3.5 mT is 0.5%, the resistance change ratio from 1.0 to 1.5 mT is only 0.2%. Accordingly, even if a magnetic field can be detected in a high magnetic field, it is difficult to detect a magnetic field in a low magnetic field, which is not suitable for a magnetic sensor of the multiple magnetic field detection type.

On the other hand, as for the $Ni_{80}Fe_{12}Co_8$ magnetic film, the resistance change ratio from 1.0 to 1.5 mT is 0.4%, while the resistance change ratio from 3.0 to 3.5 mT is 0.4%. For a magnetic sensor that outputs detection outputs of two or more magnetic fields, a magnetic film whose resistance value is sufficiently changed over such a wide magnetic field range is necessary. For example, there is required a magnetic film whose resistance value is changed by 0.3% or more in both ranges from 1.0 to 1.5 mT and from 3.0 to 3.5 mT. So as to realize the magnetic field, it is necessary to set the anisotropic magnetic field ($H_k$) to 8 Oe or more as well as 16 Oe or less.

Figure 8:
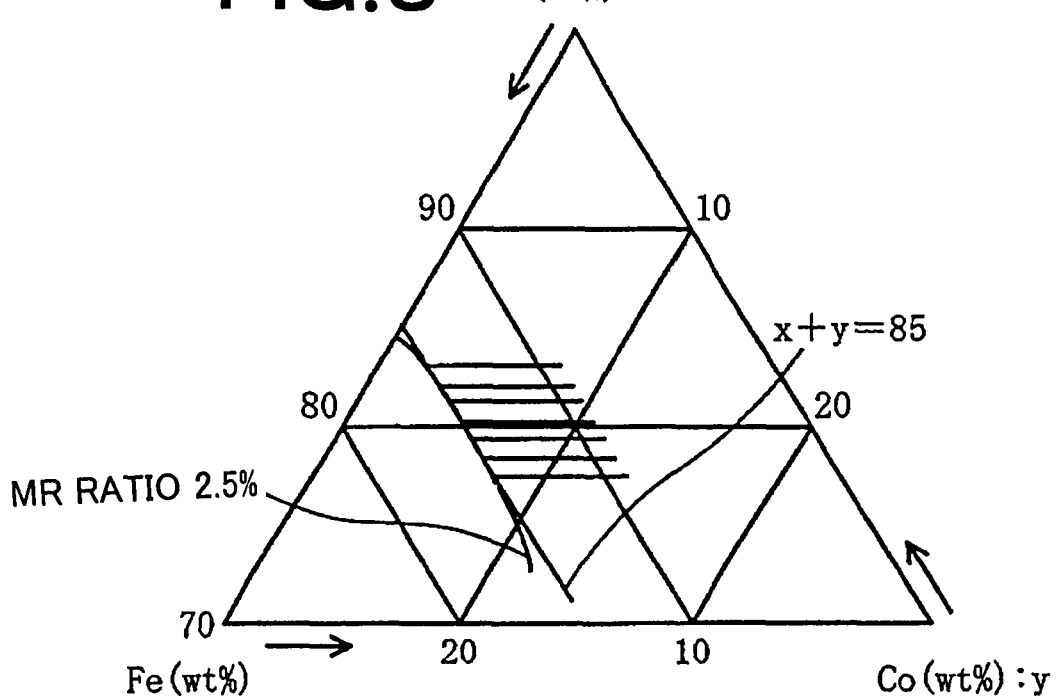
FIG. 8 is a diagram showing a ternary state of the MR ratio of a NiFeCo magnetic film formed by employing the vacuum evaporation method in the embodiment.

FIG. 8 is a diagram indicative of the ternary state of the MR ratio of a NiFeCo magnetic film that is formed by employing the vacuum evaporation method. The thickness of the magnetic film is 40 nm. As shown in FIG. 8, a part of the line of the composition corresponding to MR ratio 2.5% comes into contact with a straight line of "$x+y=85$". In the region of "$x+y \geq 85$" corresponding to the upper right side of the straight line, the MR ratio comes to be 2.5% or more.

Figure 9:
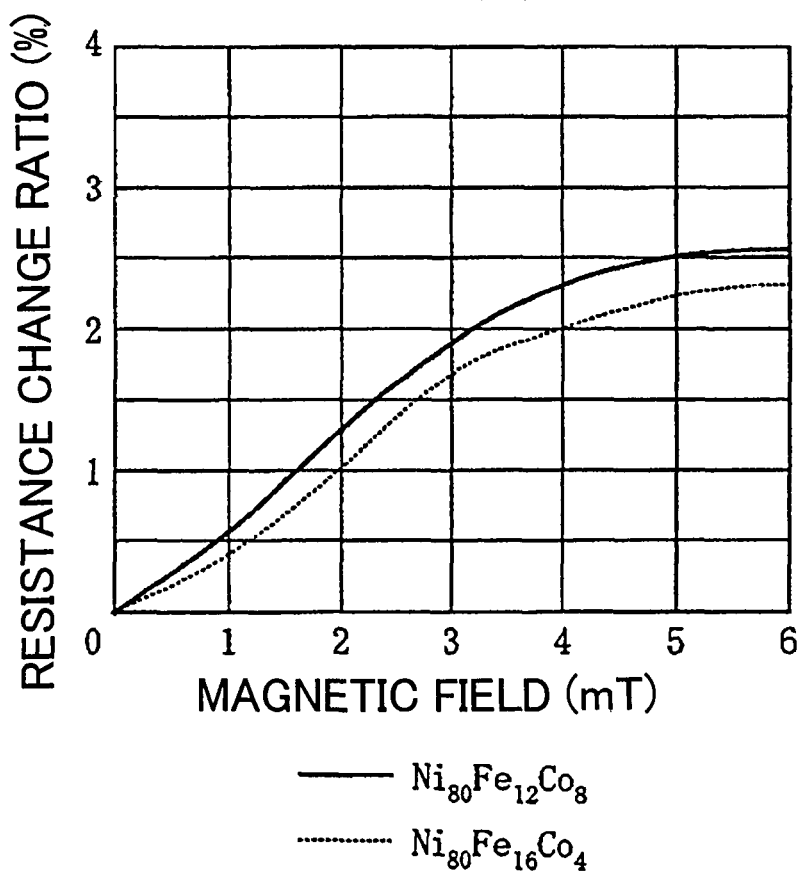
FIG. 9 is a diagram showing a comparison of $Ni_{80}Fe_{12}Co_8$ magnetic film and $Ni_{80}Fe_{16}Co_4$ magnetic film in the embodiment.

FIG. 9 shows a graphical representation which compares $Ni_{80}Fe_{12}Co_8$ magnetic film whose magnetic resistance change ratio is 2.6% and $Ni_{80}Fe_{16}Co_4$ magnetic film whose magnetic resistance change ratio is 2.3% at 6 mT respectively. As compare with the $Ni_{80}Fe_{12}Co_8$ magnetic film, the $Ni_{80}Fe_{16}Co_4$ magnetic film is small in resistance change, that is, the resistance change ratio from 1.0 to 1.5 mT is 0.3%, while the resistance change ratio from 3.0 to 3.5 mT is 0.2%. Accordingly, the $Ni_{80}Fe_{16}Co_4$ magnetic film is not suitable for a magnetic sensor of the multiple magnetic field detection type. For this type of magnetic sensor, the magnetic resistance change ratio of 2.5% or more is required.

As has been described above, if there is used as a magnetic film an alloy metal thin film including Ni, Fe and Co as main components which has the magneto-resistance effect is within a composition range that concurrently fulfill the above-described mathematical expressions of (1) to (4), where the composition ratio of Ni is represented by x % by weight, while the composition ratio of Co is represented by y % by weight, the magnetic film comes to have the magnetic characteristics in which the absolute value of the magneto-striction constant ($\lambda$) is $1.5 \times 10^{-5}$ or less, the anisotropic magnetic field ($H_k$) is 8 Oe or more as well as 16 Oe or less, and the magnetic resistance change ratio (MR ratio) is 2.5% or more. As a result, it becomes possible to produce a magnetic sensor that detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more.

On the other hand, by changing the method of forming a film or the condition of forming the film, even if all the mathematical expressions of (1) to (4) are not fulfilled, it may become possible to form a magnetic film having the magnetic characteristics in which the absolute value of the magneto-striction constant ($\lambda$) is $1.5 \times 10^{-5}$ or less, the anisotropic magnetic field ($H_k$) is 8 Oe or more as well as 16 Oe or less, and the magnetic resistance change ratio (MR ratio) is 2.5% or more. Also in this case, it becomes possible to produce a magnetic sensor that detects two or more magnetic fields, at least one of which magnetic fields to be detected is 2.5 mT or more, among whose plural magnetic fields to be detected, the minimum magnetic field to be detected and the maximum magnetic field to be detected are separated by 0.5 mT or more. As the method of forming the film to be changed, other than the vacuum evaporation method, there are various methods such as the sputtering method and CVD (chemical vapor deposition) method. As the condition of forming the film to be changed, there are conditions such as the temperature of substrate or base board in forming the film, the temperature of substrate or base board in working or processing the film, the thickness of the magnetic film, etc.

Next, the method of forming the magnetic sensor 210 shown in FIG. 5 will be explained. When manufacturing the magnetic sensor 210 shown in FIG. 5, the magneto-resistance effect thin film 214, titanium film 215, and gold film 216 are evaporated in this order on the Al pad portion 212 and the other portion or the insulating protective film 213 made of SiN, SiON, SiO$_2$, etc. Next, the layered film composed of the gold film, titanium film and NiFeCo magnetic film is worked or processed into the a bridge circuit having a plurality of magnetic resistance elements connected to each other.

Next, a part of the gold film 216 excluding another part over the Al pad portion 212 is removed by milling and wet etching such that the gold film 216 is made to remain only over the Al pad portion 212. Finally, covering with the insulating film 217 made of SiO$_2$, etc. the insulating film 217 over the Al pad portion 212 is removed by reactive ion etching.

A plurality of magnetic sensors can be simultaneously manufactured by the above-mentioned steps. That is, for each magnetic sensor, an integrated circuit is formed on the respective area in a silicon wafer by the conventional processes. The integrated circuit constitutes a detecting circuit portion to be connected to the magnetic field sensing portion. The detecting circuit portion detects two or more magnetic fields on the basis of a sensing signal of the magnetic field sensing portion. The magnetic field sensing portion is formed thereon as mentioned in the above, for each magnetic sensor. Thereafter, the silicon wafer is divided into pieces appropriately to obtain a plurality of chips (sensor chips) for the respective magnetic sensors.

FIG. 11 shows a view indicative of the sectional configuration of a magnetic sensor in which the sensor chip obtained as mentioned in the above is installed. The sensor chip 241 is coupled to a pair of external terminals 242, 243 by wire bonding using gold thin wires 244, 245, and is sealed within a resin package 246. Accordingly, a magnetic sensor 250 is completed.

Above-described process is an example, and other working or processing methods can be employed such as the lift-off method in removing gold film.

FIG. 12 shows an example of a multiple magnetic field detection circuit 269 that detects two magnetic fields in thus configured magnetic sensor. A bridge circuit 255 is formed by connecting two fixed resistors 251, 252 and two variable resistors 253, 254. The fixed resistors 251, 252 correspond to the magnetic resistance elements 235, 236 in FIG. 10 respectively, and two variable resistors 253, 254 correspond to the magnetic resistance elements 234, 233 in FIG. 10 respectively. The connection point 256 between the fixed resistor 251 and the variable resistor 253 is connected to the respective negative side input terminals of first and second comparators 257, 258. On the other hand, the connection point 259 between the fixed resistor 252 and the variable resistor 254 is connected to the respective positive side input terminals of the first and second comparators 257, 258. The connection point 261 between the fixed resistor 251 and the variable resistor 254 is connected to the respective positive side power terminals of the first and second comparators 257, 258 as well as to the positive side power terminal 263 of a power supply V$_{dd}$. On the other hand, the connection point 262 between the fixed resistor 252 and the variable resistor 253 is connected to the respective negative side power terminals of the first and second comparators 257, 258 as well as to the earth terminal 264 of ground GND. The connection points 256, 259, 261, 262 are shown in FIG. 10 as the terminal pad portions.

The output side of the first comparator 257 is connected to the input side of a first MOS (Metal Oxide Semiconductor) drive circuit 265 that has its output side connected to a first output terminal 266. The output side of the second comparator 258 is connected to the input side of a second MOS drive circuit 267 that has its output side connected to a second output terminal 268.

A detecting circuit portion comprising the first and second comparators 257, 258 and first and second MOS drive circuits 265, 267 is formed in the substrate or base board of the sensor chip 241 as an integrated circuit for controlling the detection.

In thus configured multiple magnetic field detection circuit 269, when a magnetic field is applied, the two variable resistors 253, 254 configuring the bridge circuit 255 have their resistance values changed. The differences in potential between the connection points 256, 259 due to the change in resistance value of the two variable resistors 253, 254 are detected by the first and second comparators 257, 258. One of the first and second comparators 257, 258 is so adjusted as to sufficiently respond to the voltage change corresponding to the change in magnetic field in high magnetic field region. In this case, the other of the first and second comparators 257, 258 is so adjusted as to sufficiently respond to the voltage change corresponding to the change in magnetic field in low magnetic field region. The voltage changes as the comparison results in the first and second comparators 257, 258 can be read out as the voltage changes at the output terminals 266, 268 of the corresponding first and second MOS drive circuits 265, 267 relative to the ground GND. The detecting circuit portion 269 detects a plurality of magnetic fields on the basis of sensing signals of the magnetic field sensing portion, which are obtained from the bridge circuit 255.

Figure 15:
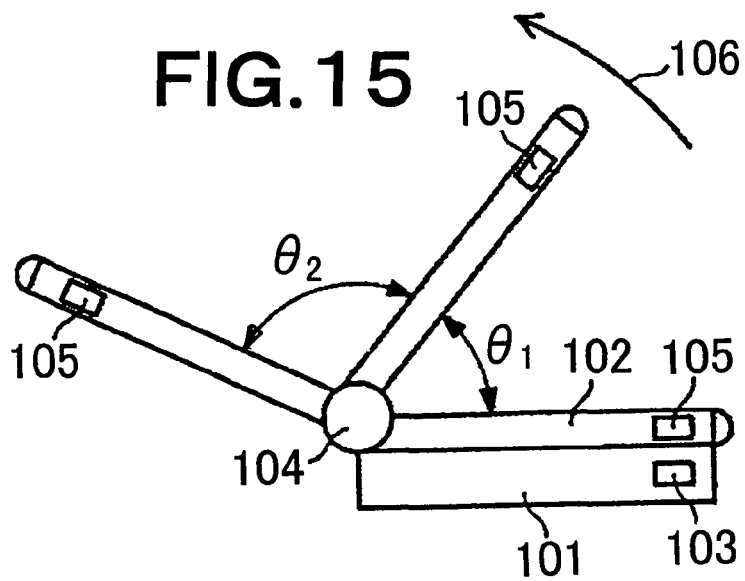
FIG. 15 is a side view of a flip phone that is of the closed state and of the opened states forming two different angles.

When being employed in an electronic device such as the flip phone shown in FIG. 15, the above-described magnetic sensor using the alloy metal thin film in this embodiment can be used as an opening/closing sensor for detecting plural rotation angles. Such an electronic device comprised the above-mentioned magnetic sensor and a control circuit which outputs a control signal which varies depending on plural detection results with respect to the magnetic fields by the magnetic sensor, for example outputs obtained at the output terminals 266, 268. As signals which are different depending on the plural detection results, there are exemplified a first one for displaying a first information on a display of flip phone when the second housing 102 is opened relative to the first housing 101 by an angle $\theta_1$ and a first predetermined magnetic field detection signal is obtained at the output terminal 266, and a second one for displaying a second information on the display when the second housing 102 is opened relative to the first housing 101 by an angle $\theta_2$ and a second predetermined magnetic field detection signal is obtained at the output terminal 268.

The magnetic sensor provided with the multiple magnetic field detection function may be employed as a magnetic sensor similar to the conventional one that detects not plural magnetic fields but a single magnetic field by using one of the lower sensitivity side or higher sensitivity side of the detection function. In this case, plural kinds of magnetic sensors do not have to be prepared, and the magnetic sensor is used for lower sensitivity or higher sensitivity, which brings about an effect of reducing the stock articles for the user.

Furthermore, the magnetic sensor can be employed not only for a flip phone but also for various electronic devices such as a folded-type PHS (Personal Handy-phone System) and a notebook personal computer. Moreover, as a sensor using the magnetic sensor, there may be various sensors such as a flow volume count sensor of a water mater or a gas meter, a position detection sensor for the automatic focus mechanism of a cylinder or a camera, a pachinko-ball detection sensor, and an opening/closing sensor of a door. Yet moreover, the NiFeCo alloy metal thin film having the composition range and magnetic characteristics according to the present invention may be employed in a magnetic head.

Furthermore, when being employed in an electronic device, the magnetic sensor may be employed not only in the flip phone shown in FIG. 15, but also in an electronic device that detects a displacement of one housing relative to the other housing.

Figure 13:
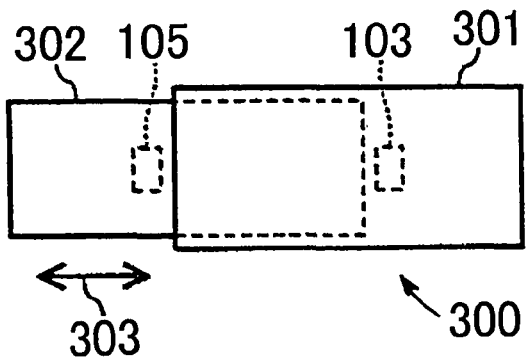
FIG. 13 is a plan view showing an electronic device that has its one housing made slidable with respect to the other housing.

FIG. 13 shows an example of an electronic device that has its one housing made slidable with respect to the other housing. In an electronic device 300 which is typified by a cellular phone, a second housing 302 can slidably reciprocate with respect to a first housing 301 in a direction of an arrow 303. The first housing 301 has arranged therein a magnetic sensor 103, while the second housing 302 has arranged therein a magnet 105. The magnetic sensor 103 and magnet 105 may be reversely arranged.

Figure 14:
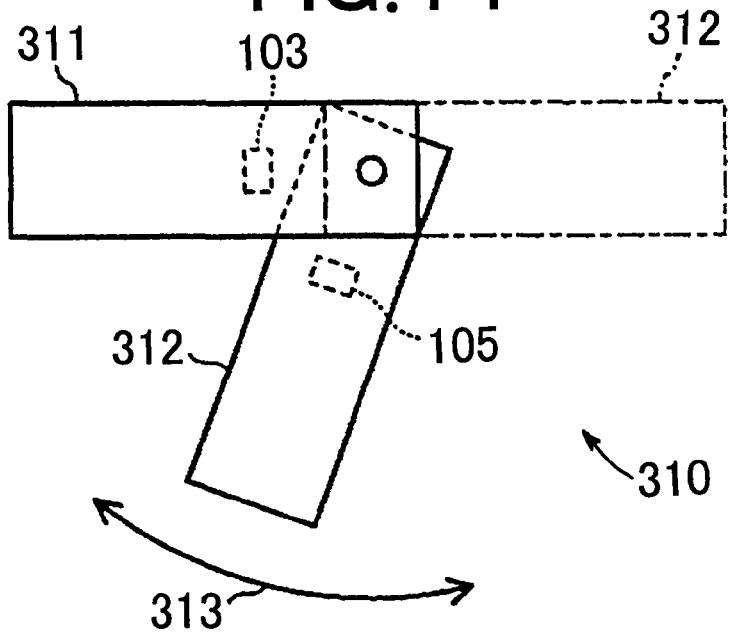
FIG. 14 is a plan view showing an electronic device that has its one housing made rotatable with respect to the other housing.

FIG. 14 shows an example of an electronic device that has its one housing made rotatable on a plane with respect to the other housing. In an electronic device 310 which is typified by a cellular phone, a second housing 312 can pivot with respect to a first housing 311 in a direction of an arrow 313. The first housing 311 has arranged therein a magnetic sensor 103, while the second housing 312 has arranged therein a magnet 105. The magnetic sensor 103 and magnet 105 may be reversely arranged.

The present invention may be applied to other displacements so long as the distance between the magnetic sensor 103 and the magnet 105 is changed. The number of the magnet 105 is not restricted to one, that is, there may be employed a configuration in which the plural magnets 105 are arranged and the magnetic sensor 103 detects combined magnetic fields thereof. In any case, the present invention can realize detecting a plurality of displacements and circuit performances based on the detection.

What is claimed is:

1. An electronic device comprising:
a magnetic sensor which has a magnetic field sensing portion having an alloy metal thin film including Ni, Fe and Co as main components and having a magneto-resistance effect, wherein the alloy metal thin film is within a composition range which concurrently fulfills the following relations:

$21x + 19y \leq 1869$, $5x + 28y \geq 546$, $y \leq 11$, and $x + y \geq 85$, where a composition ratio of Ni is represented by x % by weight, while a composition ratio of Co is represented by y % by weight,
wherein the magnetic field sensing portion has two variable and two fixed resistors formed by the alloy metal thin film, and the variable and fixed resistors constitute a bridge circuit having a first and second connection points from which a sensing signal of the magnetic field sensing portion is obtained;
a first comparator having a first negative side input terminal connected to the first connection point of the bridge circuit and a first positive side input terminal connected to the second connection point of the bridge circuit;
a second comparator having a second negative side input terminal connected to the first connection point of the bridge circuit and a second positive side input terminal connected to the second connection point of the bridge circuit;
a first drive circuit connected to the first comparator;
a second drive circuit connected to the second comparator;
a first member; and
a second member which is movable relative to the first member,
wherein a magnetic sensor is attached to the first member and a magnet is attached to the second member, or, the magnetic sensor is attached to the second member and the magnet is attached to the first member,
wherein the magnetic sensor is configured to detect a first and second magnetic fields generated by the magnet, the first magnetic field being 2.5 mT or more and detected when the first and second members are in a first positional relationship, the second magnetic field being lower than the first magnetic field by 0.5 mT or more and detected when the first and second members are in a second positional relationship where the magnetic sensor and magnet are separated from each other by an extent greater than the first positional relationship,
wherein one of the first and second comparators is configured to sufficiently respond to the voltage change corresponding to change in magnetic field in high magnetic field region, so that the corresponding first or second drive circuit outputs a first predetermined magnetic field detection signal to obtain a first detection result,
wherein another of the first and second comparators is configured to sufficiently respond to the voltage change corresponding to change in magnetic field in low magnetic field region, so that the corresponding first or second drive circuit outputs a second predetermined magnetic field detection signal to obtain a second detection result, and
wherein the electronic device further comprises a control circuit which outputs a control signal which varies depending on the first and second detection results.

2. The electronic device as claimed in claim 1, wherein the alloy metal thin film has an absolute value of magneto-striction constant of $1.5 \times 10^{-5}$ or less, an anisotropic magnetic field of 8 Oe or more as well as 16 Oe or less, and a magnetic resistance change ratio of 2.5% or more.

3. The electronic device as claimed in claim 1, wherein the alloy metal thin film has a thickness of 20 nm or more as well as 60 nm or less.

4. The electronic device as claimed in claim 1, wherein the alloy metal thin film is a film formed by a vacuum evaporation method.

5. The electronic device as claimed in claim 1, wherein the variable and fixed resistors are formed into a zigzag shape.

6. The electronic device as claimed in claim 1, wherein the variable and fixed resistors are formed into a zigzag shape, and a longitudinal direction of the zigzag shape of the variable resistors is perpendicular to a longitudinal direction of the zigzag shape of the fixed resistors.

7. The electronic device as claimed in claim 1, wherein the first and second comparators constitute a detecting circuit portion which is formed on an integrated circuit board, and the alloy metal thin film is formed on integrated circuit board via an insulating film.

8. The electronic device as claimed in claim 7, wherein the detecting circuit portion and the magnetic field sensing portion are formed into a chip including the integrated circuit board, the chip is sealed with a resin package, and the detecting circuit portion is connected to an external terminal partially exposed to the outside from the resin package.

9. The electronic device as claimed in claim 1, wherein the alloy metal thin film has a first resistance value for a first magnetic field, and a second resistance value for a second magnetic field, and wherein the first and second resistance values have a 0.3% or more difference.

10. A method of manufacturing the magnetic sensor as claimed in claim 1, having an alloy metal thin film forming step of forming the alloy metal thin film on a substrate.

11. The method as claimed in claim 10, wherein the alloy metal thin film is formed in the alloy metal thin film forming step so as to have a thickness of 20 nm or more as well as 60 nm or less.

12. The method as claimed in claim 10, wherein the alloy metal thin film is formed by a vacuum evaporation method in the alloy metal thin film forming step.

13. The method as claimed in claim 10, further having a detecting circuit portion forming step of forming a detecting circuit portion to be connected to the magnetic field sensing portion on the substrate.

14. An electronic device comprising the magnetic sensor as claimed in claim 1, and a control circuit which outputs a control signal which varies depending on plural detection results with respect to the magnetic fields by the magnetic sensor.

15. The electronic device as claimed in claim 14, further comprising a first member and a second member which is movable relative to the first member, wherein the magnetic sensor is attached to the first member, and a magnet is attached to the second member.

* * * * *